United States Patent [19]

Pflueger et al.

[11] Patent Number: 5,967,740
[45] Date of Patent: Oct. 19, 1999

[54] DEVICE FOR THE TRANSPORT OF OBJECTS TO A DESTINATION

[75] Inventors: John Pflueger; Lawrence R. Gravell, both of Austin, Tex.

[73] Assignee: Jenoptik Aktiengesellschaft, Jena, Germany

[21] Appl. No.: 08/977,588

[22] Filed: Nov. 25, 1997

[51] Int. Cl.⁶ .................................................. B65G 29/00
[52] U.S. Cl. ........................................... 414/750; 414/659
[58] Field of Search ................................... 414/217, 223, 414/750, 940, 659, 660; 74/590, 591, 603

[56] References Cited

U.S. PATENT DOCUMENTS

| | | | |
|---|---|---|---|
| 1,608,720 | 11/1926 | Carter | 74/590 |
| 3,655,070 | 4/1972 | Haydu | 414/750 X |
| 4,027,767 | 6/1977 | Gluck | 414/223 X |
| 4,166,424 | 9/1979 | Hahn et al. | 414/750 X |
| 4,273,507 | 6/1981 | Herdzina et al. | 414/750 |
| 4,803,895 | 2/1989 | Nishizawa et al. | 74/603 |
| 4,871,290 | 10/1989 | Kaczynski et al. | 414/223 X |
| 5,052,257 | 10/1991 | Eigermann | 74/603 X |
| 5,085,312 | 2/1992 | Ribordy et al. | 414/223 X |
| 5,407,314 | 4/1995 | Kempf | 414/217 |
| 5,467,706 | 11/1995 | Kato | 74/603 X |
| 5,468,111 | 11/1995 | Flint et al. | 414/940 X |
| 5,570,990 | 11/1996 | Bonora et al. | 414/543 |
| 5,636,724 | 6/1997 | Scheler et al. | 414/940 X |
| 5,655,869 | 8/1997 | Scheler et al. | 414/940 X |

FOREIGN PATENT DOCUMENTS

| | | | |
|---|---|---|---|
| 61-79544 | 4/1986 | Japan | 414/660 |

*Primary Examiner*—James W. Keenan
*Attorney, Agent, or Firm*—McAulay Nissen Goldberg Kiel & Hand, LLP

[57] ABSTRACT

A device for transporting objects to a destination has the aim of providing an economical and simplified design of a technical solution for transferring containers in an ergonomic manner such that the operating processes are substantially facilitated. A transfer mechanism contains, on a vertically adjustable platform, a carrier for the object to be transported, which carrier can be extended horizontally in the direction of the destination. There is provided a compulsory linking of the vertical adjustment of the platform and the horizontal adjustment of the carrier and a shared driving element is provided for both adjustments. The device is used for the transport of objects in semiconductor fabricating plants.

6 Claims, 8 Drawing Sheets

DEVICE FOR THE TRANSPORT OF OBJECTS TO A DESTINATION

BACKGROUND OF THE INVENTION a) Field of the Invention

The invention is directed to a device for transporting objects to a destination with at least one transfer mechanism for transferring the objects between the device and a receiving element for receiving the objects at the destination.

Such devices can be used mainly in semiconductor fabricating plants and by manufacturers for outfitting such fabricating plants.

b) Description of the Related Art

In semiconductor fabricating plants, it is customary for the substrates that are to be processed to be transported in open or closed containers between various locations and various processing devices by means of transport devices which are especially constructed for this purpose. In so doing, the handling of the containers during the required loading and unloading processes should be effected in an ergonomic manner for the operators. This is particularly important as the size of the substrate to be processed increases and accordingly as the size and weight of the containers increase.

Known simple transport cars have a simple storage capability for the containers and require that the loading and unloading be performed by the operator.

Automatically controlled vehicles require no input on the part of the operator, since these vehicles can move independently by means of their electronic equipment and corresponding auxiliary systems.

U.S. Pat. No. 5,570,990 describes a mobile loading device in the form of a cart with a swivelable transport arm having a plurality of members which are pivotally connected with one another by means of joints. The transport arm is fastened at the upper end of a vertically adjustable shaft. The swivelable transport arm serves to transport SMIF containers to a semiconductor processing station and back to the cart. To this end, the containers are grasped by a gripper and set down on the depositing space in the semiconductor processing station by a swiveling movement. The return transport is effected in the reverse manner. The processes are controlled and monitored by communicating means for communication between the semiconductor processing station and the cart.

While the operator must carry out the movements with the transport arm in the x-y plane by rotating the joints between the members of the transport arm without additional support, a motor-driven auxiliary device is provided for movements of the transport arm in the z direction in order to facilitate handling of heavy objects.

It is disadvantageous that separate operating processes are required for different transport movement directions. This makes the work sequence as well as the construction of the transport device more complicated and accordingly more costly.

It is especially important to provide a solution which is as simple as possible when using a transport system as an interim solution for an automatic system because the containers to be transported overstep permissible ergonomic boundaries. Manually operated transport systems are required precisely in the early and middle construction phases in semiconductor fabricating plants in order to optimize outfitting and work sequences. However, such interim solutions rule out the use of automatic systems with complicated and expensive electronics and sensor systems for cost reasons.

OBJECT AND SUMMARY OF THE INVENTION

The primary object of the invention is an economical and simplified design of a technical solution for transferring containers in an ergonomic manner such that the operating processes are substantially facilitated.

According to the invention, this object is met by means of a device for transporting objects to a destination with at least one transfer mechanism for transferring the objects between the device and an element for receiving the objects at the destination. The transfer mechanism contains a carrier for the object on a vertically adjustable platform, which carrier can be moved out horizontally in the direction of the destination. Means are provided for a compulsory or positive linking of the vertical adjustment of the platform and the horizontal adjustment of the carrier and shared driving means are provided for both adjustments.

The transfer mechanism is advantageously fastened to a movable frame.

The platform which is guided vertically in sliding bearings at the frame has a recess in its central region through which an upper portion of an axially displaceable shaft which is actuated by the shared driving means is guided in the vertical direction. The shaft contains a crank at its upper end and a cam at its lower end face, as the crank is turned the cam rests on a cam follower which is supported in the frame. The cam profile governs the vertical adjustment of the platform.

A roller provided at the outer end of the crank engages in a slot of a yoke which connects a pair of first sliding rails with one another. Each of the first sliding rails whose guides are rigidly connected with the platform serves as a guide rail for second sliding rail and carries a strip rotating on rollers at the first sliding rail. The guide and the second sliding rail which serves to receive the object being fastened to this strip.

The cam is advantageously divided into regions. A first region, when contacting the cam follower, holds the platform in a lower position, a second region and a third region which adjoin a first region and a fourth region cause the platform to be raised into an upper position and then lowered until reaching the lowest position. Finally, the fourth region holds the platform in the upper position.

In an alternative variant of the yoke, the slot in which the crank engages with the roller contains at least one widened portion in at least one direction of horizontal adjustment of the carrier to generate a special movement of horizontal adjustment.

In a special construction, the platform is vertically guided in sliding bearings in a turntable fastened to the frame. This allows the platform to be oriented in different position for the delivery of the payload in an arbitrary direction.

In order to compensate for the platform mass, compensation masses may be advantageously provided. The compensation masses can be arranged at the end of a lever arm of levers whose lever joints are fastened to the frame and whose other lever arm end supports the platform by a roller.

The invention is explained more fully with reference to the schematic drawing.

DESCRIPTION OF THE PREFERRED EMBODIMENTS

Figure 1:
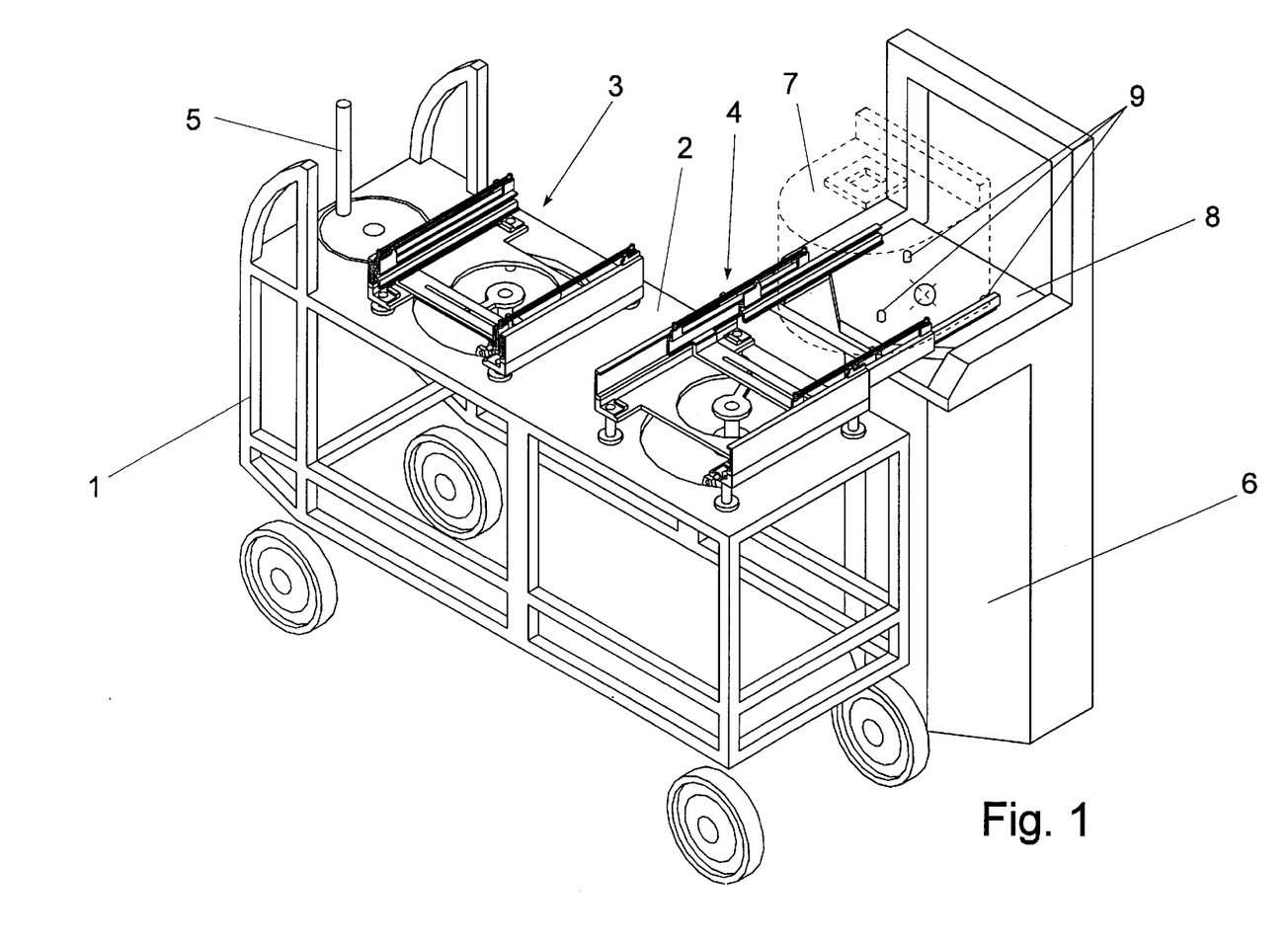
FIG. 1 shows a transport device with two transfer mechanisms for transferring containers between the transport device and a loading and unloading station.

The transport device, shown in FIG. 1, in the form of a manually guided vehicle contains a plate 2 with two transfer mechanisms 3, 4 on a movable frame 1, and a hand crank 5. In the present example, operation switching means, not shown, are provided for transmitting force to the respective transfer mechanism 3 or 4. Of course, it is also possible to operate both transfer mechanisms 3, 4 by separate driving means. The transport device is arranged in front of a loading and unloading station 6 serving as a destination for a container 7 which is the object to be transported. Particularly suitable objects are containers for receiving substrates (semiconductor wafers, reticles and templates) or other flat objects with a lateral opening by which the container 7 can be coupled to the loading and unloading station 6. The container 7 is transferred to a receiving element 8 by means of one of the transfer mechanisms 3, 4. In the present instance, this is transfer mechanism 4 which is already in a raised and partially extended state, whereas the other transfer mechanism 3 is retracted and lowered.

The motion of the entire transfer mechanism 4 is governed by actuation of the hand crank 5. As the hand crank 5 is initially turned, the transfer mechanism 4 raises. Further motion of the hand crank 5 results in the extension of the transfer mechanism 4 and the container 7 to the loading and unloading station 6, the lowering of the transfer mechanism 4, and the subsequent retraction of the transfer mechanism 4. As the transfer mechanism 4 retracts, it leaves the container 7 on the station 6. This is the delivery operation. Reversal of the hand crank motion will result in the opposite container motion (retrieve).

Alignment elements in the form of grooves (not shown) and engaging pins 9 in a three-point formation which are constructed to complement one another are provided in the base of the container 7 and in the receiving element 8 for depositing in an oriented manner. The transfer mechanism 4 is then moved into the position which is shown for the other transfer mechanism 3. The container 7 which is shown only in a very simplified manner in FIG. 1 is so constructed that the supporting parts of the transfer mechanism are not hindered in their horizontal motion. This applies to the motion of the transfer mechanism 4 after the container 7 has been set down, as well as to the operation sequence for transporting it from the receiving element 8 back to the transport device.

Of course, the destination is not limited to the loading and unloading station 6 shown in this embodiment example, but can also be other locations within the effective range of the transport device.

Figure 2:
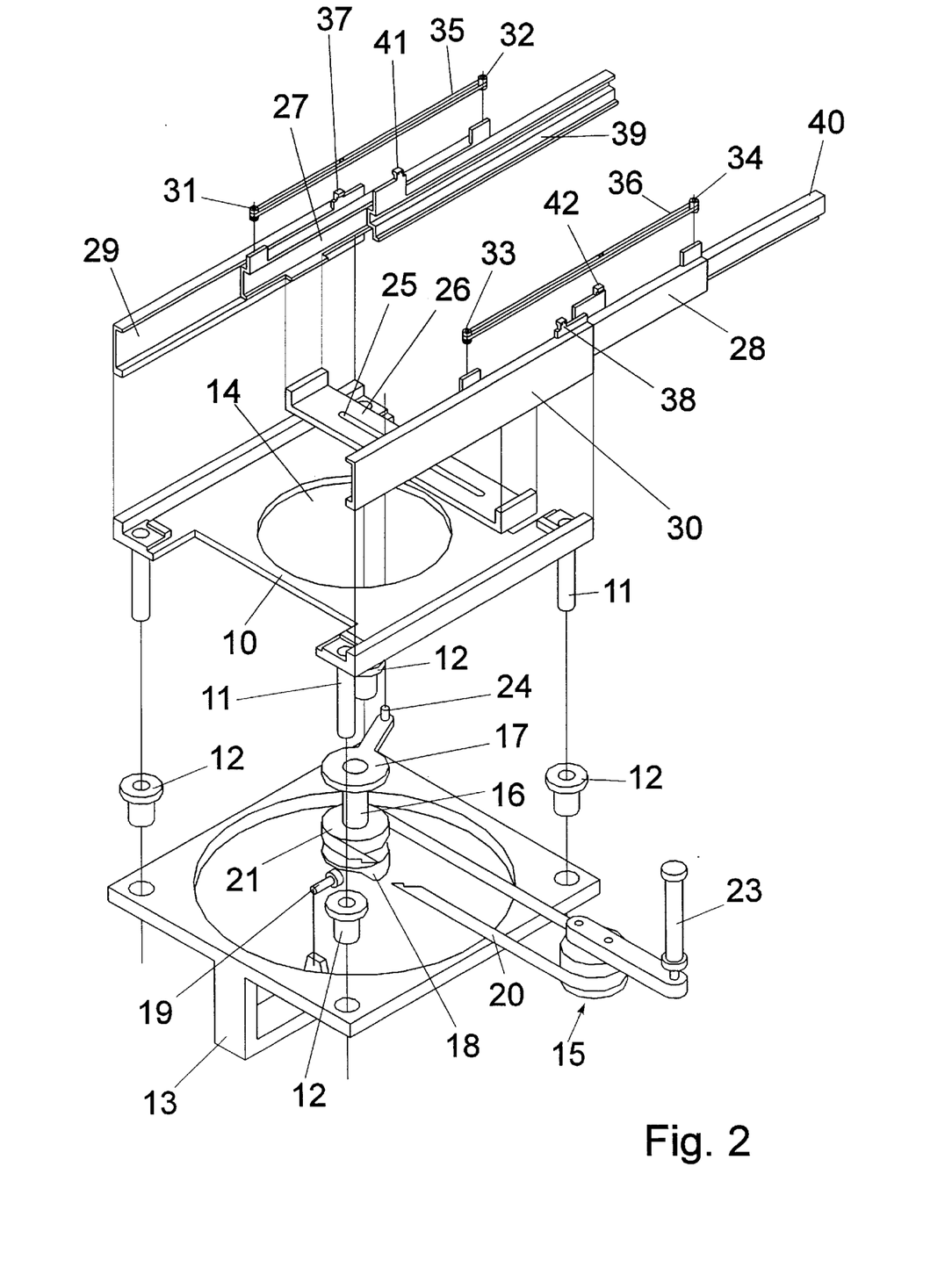
FIG. 2 shows an exploded view of a transfer mechanism.
Figure 3:
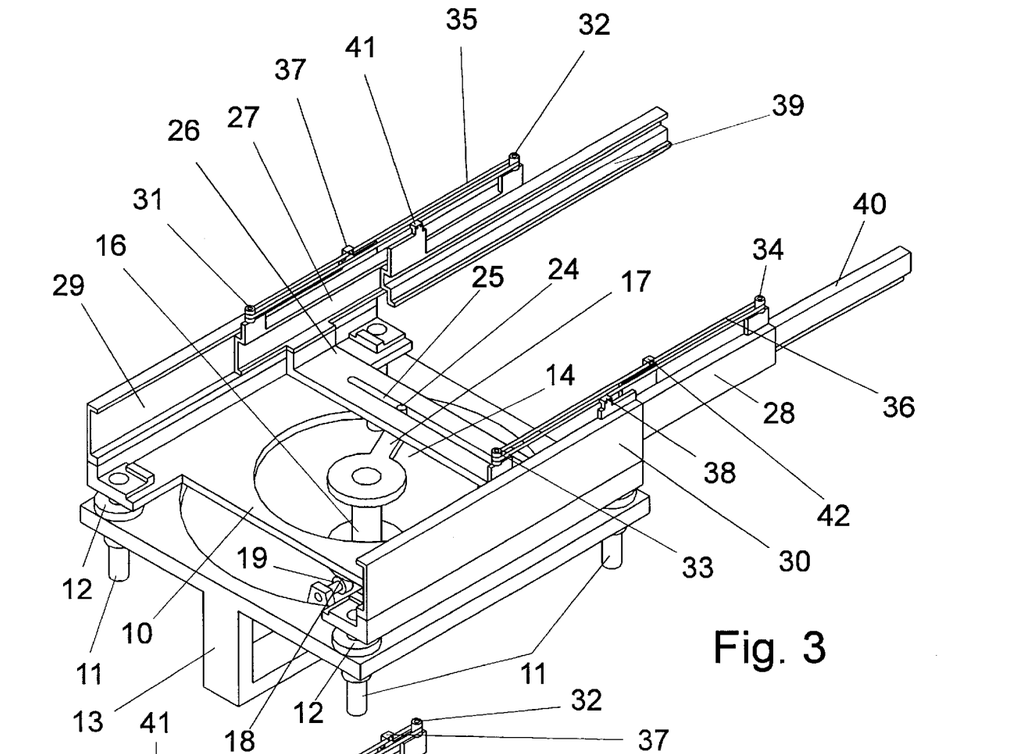
FIG. 3 shows the transfer mechanism in the extended state.
Figure 4:
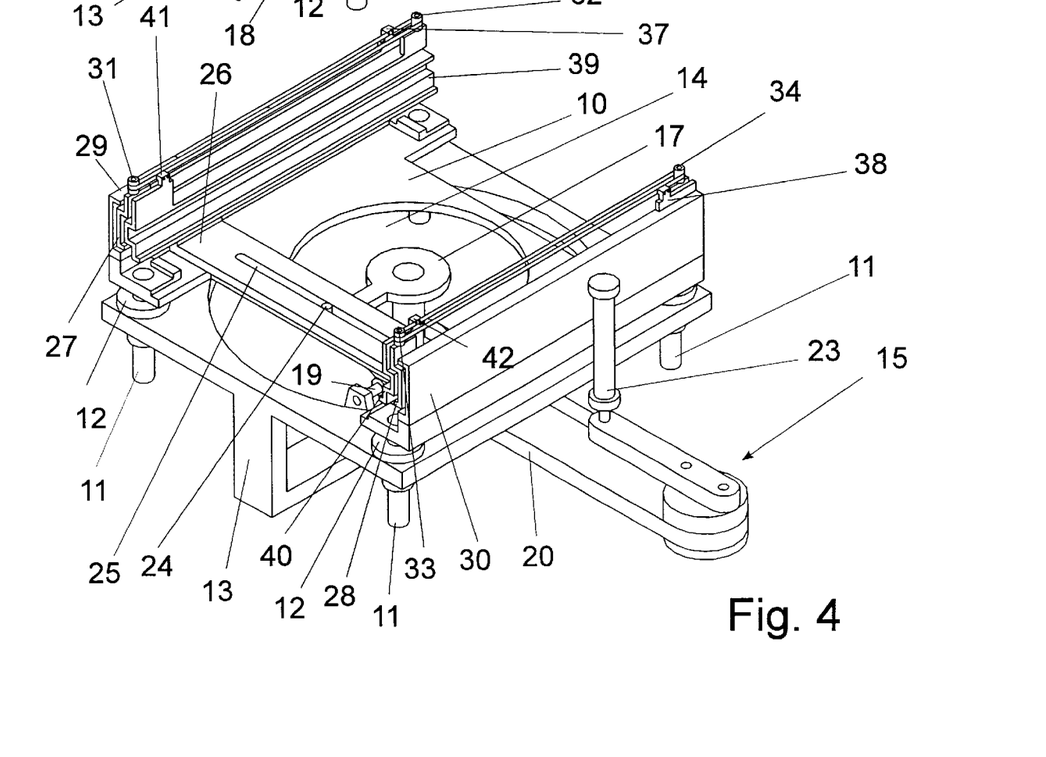
FIG. 4 shows the transfer mechanism in the retracted state.

The transfer mechanism used in the invention and its manner of operation for realizing the movement sequences will be described more precisely with reference to FIGS. 2 to 4.

Bearing projections 11 which are guided vertically in corresponding bushings 12 at an internally open frame part 13 of the frame 1 are arranged at a platform 10 for the horizontal displacement thereof. An upper portion of an axially displaceable shaft 16 actuated by shared driving means 15 is guided in the vertical direction through a recess 14 in the central region of the platform 10. While the shaft 16 carries a crank 17 at its upper end, its lower end face contains a cam 18 that rests on a cam follower 19 which is supported at the frame part 13. A driving belt 20 is placed around a belt pulley 21 at the shaft 16 for transmitting motion from driving means in the form of a hand crank 23.

By means of a roller 24 provided at its outer end, the crank 17 engages in a slot 25 of a yoke 26 which serves as a rocker and connects a first pair of sliding rails 27, 28 together. Each of the sliding rails 27, 28, whose guides 29, 30 are rigidly connected with the platform 10, carries a strip 35 and 36, respectively, which rotates on rollers 31, 32 and 33, 34, respectively. One guide 29, 30 is fastened, respectively, by its end 37, 38 facing the destination of the object to be transported, to a strip 35, 36, as is another sliding rail 39, 40 serving as a carrier for the object. The sliding rails 39, 40 whose fastening ends 41, 42 fastened to one of the strips 35, 36 face away from the destination use the sliding rails 27, 28 as guides.

By means of the construction of the horizontal guide as a three-part mechanism and as a result of the movement coupling of the mechanism parts via the rotating strip and the accommodation of the driving elements in a very compact space within the transfer mechanism, large transport distance can be covered, even with limited available space.

By actuating the hand crank 23, the shaft 16 and, along with it, the crank 17 and the cam 18 are set in rotation. While the platform 10 and the elements supported by it are displaced vertically corresponding to the curved shape due to the rolling of the cam 18 on the cam follower 19, the crank 17 causes a horizontally directed back-and-forth motion of the yoke 26. The yoke 26 transmits this movement to the sliding rails 27, 28, so that, as a result of the coupling of the strips 35, 36 with the stationary guides 29, 30, the latter drive the sliding rails 39, 40 at twice the speed at which the sliding rails 27, 28 move.

As a result of the merging of the crank 17 with the cam 18 to form a unitary driving element requiring one individual actuating element, the movements in the horizontal and vertical directions required for the transport of containers are compulsorily linked. This substantially improves user-friendliness and ergonomics.

Of course, it is also possible to use different actuating means. Thus, the hand crank 23 and the driving belt 20 can be replaced by any other mechanism which drives the shaft 16 with the crank 17 and the cam 18. For example, a direct motor connection can be provided for generating the rotating movement.

Figure 5:
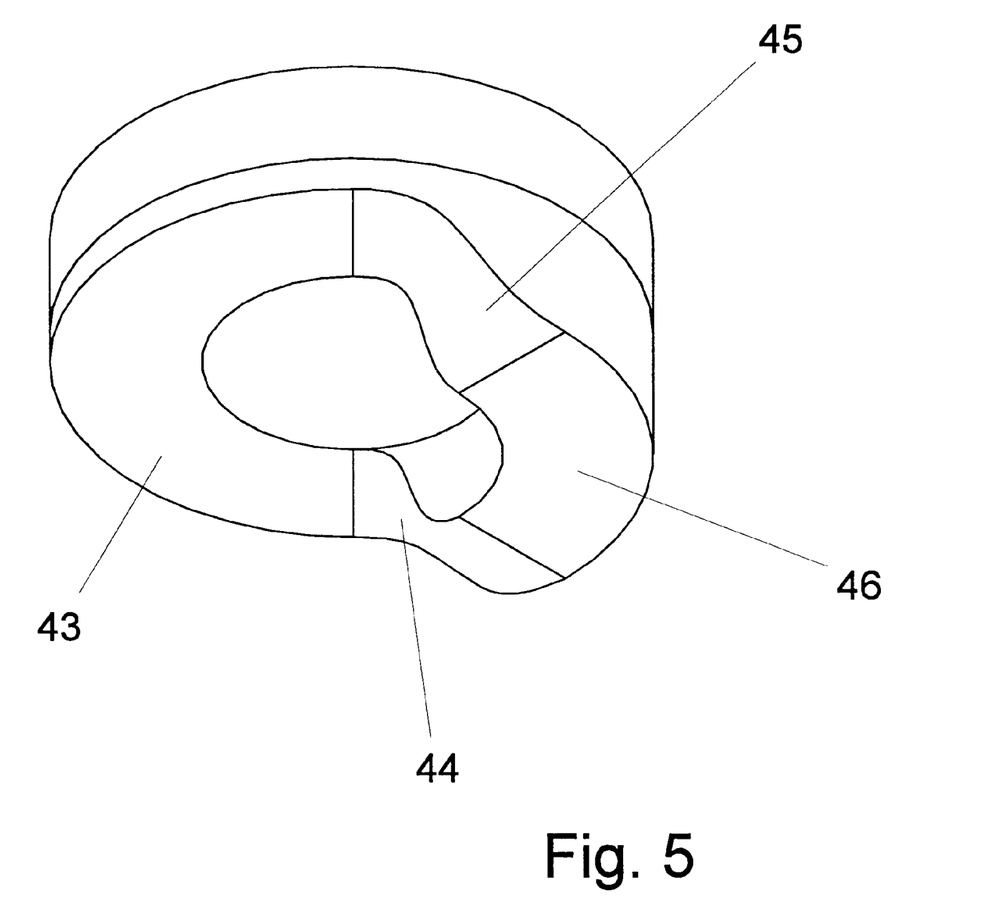
FIG. 5 shows the profile of a cam in an enlarged view.

The profile for the cam 18 shown in FIG. 5 is divided into four regions 43, 44, 45, 46 which contact the cam follower 19 when the shaft 16 rotates. When the cam 18 contacts the cam follower 19 with region 43, the platform 10 assumes its lowest position in which the sliding rails 39, 40 can be moved out horizontally together with sliding rails 27, 28 to engage under a container 7 deposited on the receiving element 8. Its return movement into the moved in position without taking along a container is also provided at this platform height.

Depending on the rotating direction of the shaft 16, the regions 44, 45 cause the platform 10 to be raised to the highest position and lowered from this position to the lowest position. Region 46 holds the highest position. The vertical movements are required when the object to be transported is to be transported to and away from the destination in the manner already described. The horizontal transport of the object itself is always effected in the highest position.

Figure 6:
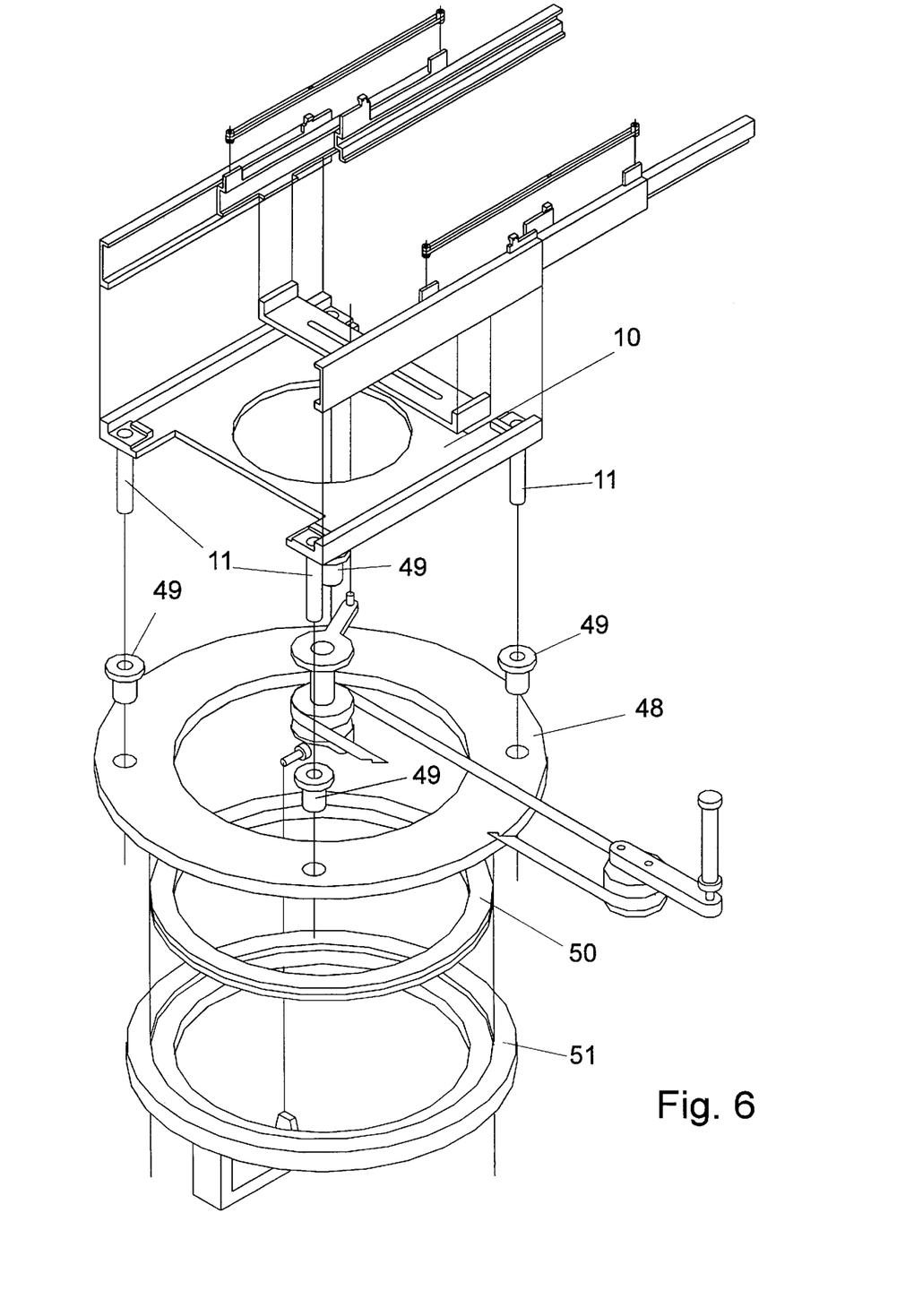
FIG. 6 shows an exploded view of a transfer mechanism which is supported on a turntable.
Figure 7:
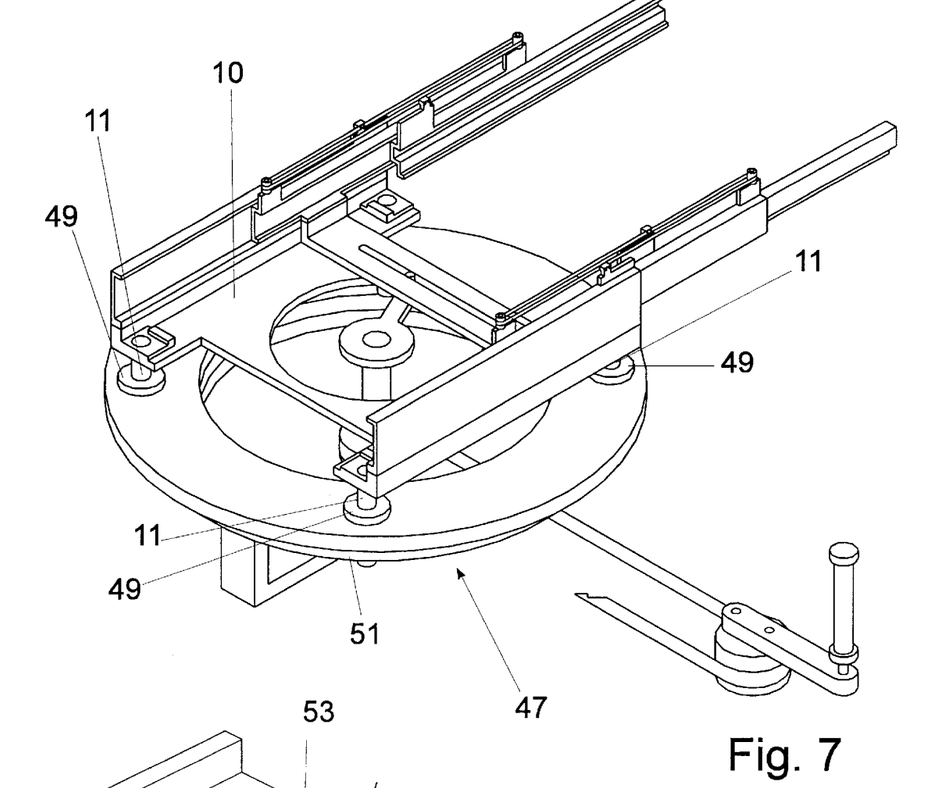
FIG. 7 shows the turntable transfer mechanism in the extended state.

In another construction of the invention according to FIGS. 6 and 7, the transfer mechanism which has already been described with reference to the Figures is placed on a turntable 47. Sliding bearing bushings 49 are provided in the outer region of a table plate 48 whose center is left open, the platform 10 being guided vertically in the sliding bearing bushings 49 by its bearing projection 11. The table plate 48 is fastened to a frame part 51 of the vehicle shaped in a complementary manner via an axial bearing 50. With a turntable 47 of this kind, the entire transfer mechanism can be rotated and the object to be transported can be transported to and away from the destination at different angles of inclination.

Figure 8:
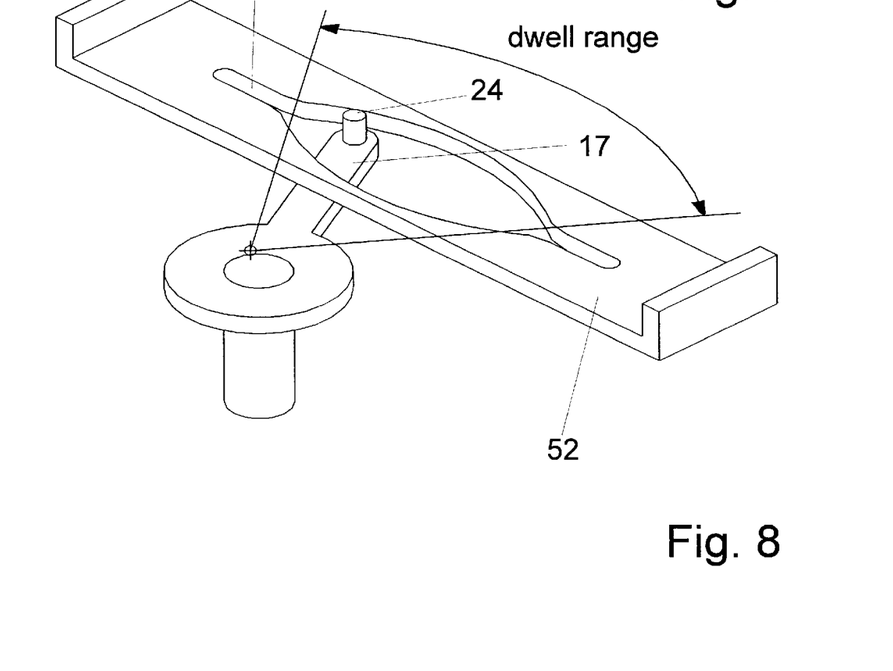
FIG. 8 shows a yoke for generating dwell positions.

In an alternative variant for a yoke 52 according to FIG. 8, the slot 53 in which the crank 17 engages by the roller 24 is widened in its central region in the direction of horizontal displacement as a dwell range. The yoke 52 accordingly occupies a dwell position at the reversal points of the back-and-forth movement, so that the platform 10 can be displaced vertically without a horizontal movement of the sliding rails 27, 28, 39 and 40. This results in increased positioning accuracy.

Figure 9:
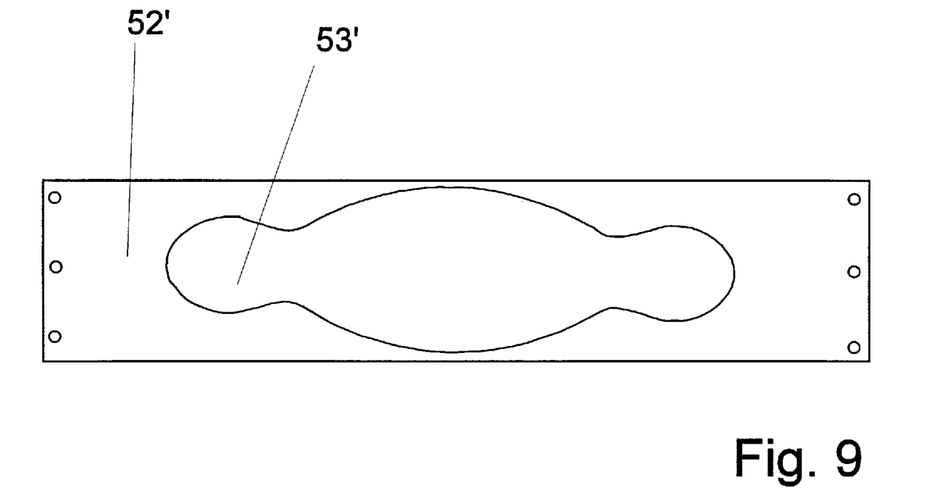
FIG. 9–FIG. 10 show modifications of the yoke of FIG. 8.
Figure 10:
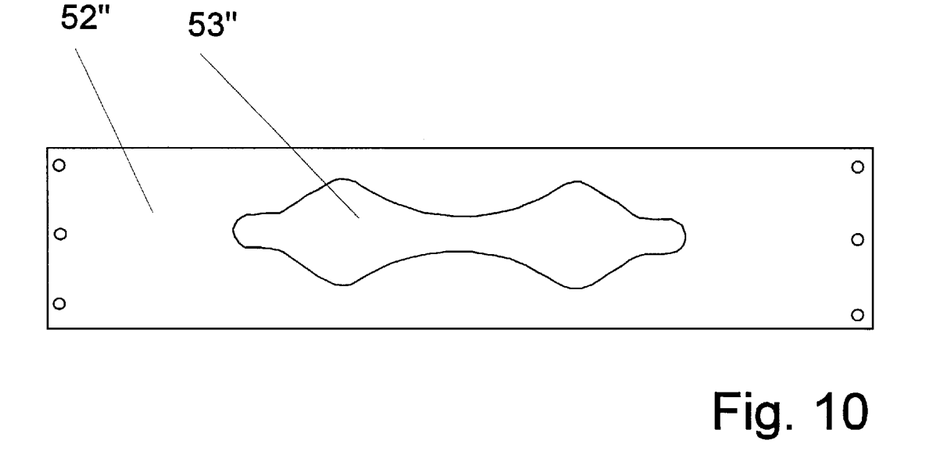

Another constructions of the yoke 52', 52" according FIG. 9 and 10 are suited for generating different movements of horizontal adjustment of the carrier. While the slot 53' in FIG. 9 contains one widened portion in its central region and widened portions in its end positions, respectively, the slot 53" in FIG. 10 is widened in two positions.

Figure 11:
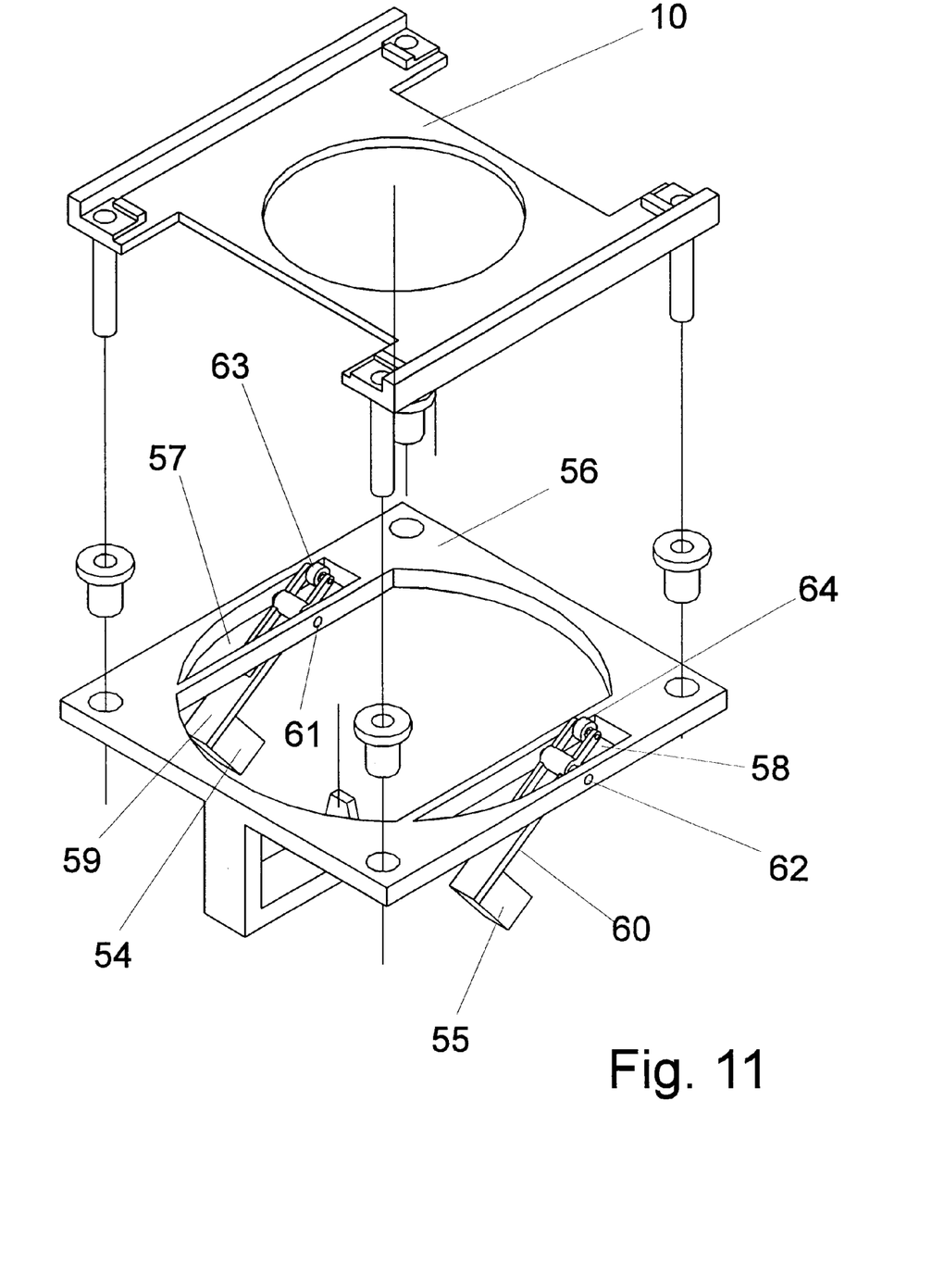
FIG. 11 shows a frame construction with compensation masses for the platform mass.

The solution according to FIG. 11 incorporates a special embodiment of a frame construction in which compensation masses 54, 55 are provided for balancing the platform mass. A frame part 56 which otherwise substantially corresponds to the frame parts 13 and 51 already described above with respect to function also has recesses 57, 58 in its edge area, levers 59, 60 being fastened therein by their lever joints 61, 62. While the longer lever arm ends carry the compensation masses 54, 55, the shorter lever arm ends, with their rollers 63, 64, support the platform 10 resting thereon. The rollers 63, 64 exert a force on the platform 10 which reduces the force that the operator must expend to raise and lower the platform 10 with the object arranged on it. The mass compensation also has advantageous results when the transfer mechanism transports the useful load in the horizontal direction.

While the foregoing description and drawings represent the present invention, it will be obvious to those skilled in the art that various changes may be made therein without departing from the true spirit and scope of the present invention.

What is claimed is:

1. A device for transporting an object or objects to a destination, comprising:

at least one transfer mechanism fastened to a movable frame for transferring the object of objects between the device and a receiving element for receiving the object or objects at the destination;

said transfer mechanism contains a carrier for the object or objects;

said carrier being mounted on a vertically adjustable platform;

means for vertically adjusting said platform;

means for generating a horizontal adjustment of said carrier in a direction of the destination and in a reverse direction;

shared driving means for the vertical adjustment of said platform and the horizontal adjustment of said carrier;

means for a compulsory linking of the vertical adjustment of said platform and the horizontal adjustment of said carrier;

sliding bearings within said frame; and an axially displaceable shaft, wherein said platform which is guided vertically in said sliding bearings at said frame has a recess in its central region through which an upper portion of said axially displaceable shaft which is actuated by said shared driving means is guided in the vertical direction, and wherein the shaft contains a crank at its upper end and a cam at its lower end face, wherein said cam rests on a cam follower which is supported in said frame to govern the vertical adjustment of said platform.

2. The device according to claim 1, further comprising a yoke having a slot; and sliding rails having guides; wherein said crank engages in said slot of said yoke which connects a first pair of the sliding rails with one another, wherein each of the sliding rails of the first pair, whose guides are rigidly connected with said platform, serves as a guide rail for a second sliding rail and carries a strip rotating on rollers at a first sliding rail, and wherein one of the guides and said second sliding rail are fastened to said strip.

3. The device according to claim 2, wherein said cam is divided into regions, of which a first region, when contacting said cam follower, holds said platform in a lower position, a second region and a third region which adjoin the first region and a fourth region cause said platform to be raised into an upper position and then lowered until reaching the lower position, and the fourth region holds said platform in the upper position.

4. The device according to claim 3, wherein said slot of said yoke in which said crank engages by said roller contains at least one widened portion in at least one direction of horizontal adjustment of said carrier.

5. The device according to claim 1, further comprising
a turntable fastened to said frame having said sliding bearings adapted to vertically guide said platform.

6. A device for transporting objects to a destination, comprising:

at least one transfer mechanism for transferring the objects between the device and a receiving element for receiving the objects at the destination;

said transfer mechanism contains a carrier for the objects;

said carrier being mounted on a vertically adjustable platform;

means for vertically adjusting said platform;

means for generating a horizontal adjustment of said carrier in a direction of the destination and in a reverse direction;

shared driving means for the vertical adjustment of said platform and the horizontal adjustment of said carrier;

means for a compulsory linking of the vertical adjustment of said platform and the horizontal adjustment of said carrier; and compensation masses adapted to compensate for a mass of the platform, said compensation masses being arranged at the end of a lever arm whose joint is adapted to be fastened to a frame and whose other lever arm end supports said platform.

* * * * *